United States Patent
Su

(10) Patent No.: US 9,788,437 B2
(45) Date of Patent: Oct. 10, 2017

(54) METHOD FOR MANUFACTURING PRINTED CIRCUIT BOARD WITH ETCHING PROCESS TO PARTIALLY REMOVE CONDUCTIVE LAYER

(71) Applicants: FuKui Precision Component (Shenzhen) Co., Ltd., Shenzhen (CN); HongQiSheng Precision Electronics (QinHuangDao) Co., Ltd., Qinhuangdao (CN); Zhen Ding Technology Co., Ltd., Tayuan, Taoyuan (TW)

(72) Inventor: Wei-Shuo Su, Kaohsiung (TW)

(73) Assignees: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD, New Taipei (TW)

( * ) Notice: Subject to any disclaimer, the term of this patent is extended or adjusted under 35 U.S.C. 154(b) by 0 days.

(21) Appl. No.: 14/848,517

(22) Filed: Sep. 9, 2015

(65) Prior Publication Data

US 2016/0353582 A1    Dec. 1, 2016

(30) Foreign Application Priority Data

May 27, 2015    (CN) .......................... 2015 1 0279753

(51) Int. Cl.
*H05K 1/09*    (2006.01)
*H05K 3/24*    (2006.01)
(Continued)

(52) U.S. Cl.
CPC ............. *H05K 3/244* (2013.01); *H05K 3/108* (2013.01); *H05K 3/427* (2013.01);
(Continued)

(58) Field of Classification Search
CPC ........ H05K 3/244; H05K 3/108; H05K 3/427; H05K 2201/0154; H05K 2201/0338; H05K 2203/0723
(Continued)

(56) References Cited

U.S. PATENT DOCUMENTS

2015/0216032 A1* 7/2015 Lee ...................... H05K 1/0216
361/760

FOREIGN PATENT DOCUMENTS

| TW | I257273 | 6/2006 |
| TW | I407534 | 9/2013 |
| TW | I483360 | 5/2015 |

* cited by examiner

*Primary Examiner* — Tremesha S Willis
(74) *Attorney, Agent, or Firm* — Steven Reiss

(57) ABSTRACT

The present disclosure relates to a method for manufacturing a printed circuit board. The method includes the steps as follows. First, a substrate including a base layer and a copper foil layer on a surface of the base layer is provided. Second, a conductive layer is formed on portions of the copper foil layer. Third, portions of the copper foil layer exposed from the conductive layer are removed by an etching process, and the conductive layer is thinner by the etching process. The reserved portions of the copper foil layer and the conductive layer form a conductive pattern to obtain a printed circuit board without plating wires. A printed circuit board without plating wires made by the above method is also provided.

10 Claims, 5 Drawing Sheets

(51) Int. Cl.
*H05K 3/10* (2006.01)
*H05K 3/42* (2006.01)

(52) U.S. Cl.
CPC ............. *H05K 2201/0154* (2013.01); *H05K 2201/0338* (2013.01); *H05K 2201/098* (2013.01); *H05K 2201/09736* (2013.01); *H05K 2203/0723* (2013.01); *H05K 2203/1394* (2013.01)

(58) Field of Classification Search
USPC ....... 174/257, 250, 251, 255, 256, 258, 259, 174/261, 262
See application file for complete search history.

US 9,788,437 B2

METHOD FOR MANUFACTURING PRINTED CIRCUIT BOARD WITH ETCHING PROCESS TO PARTIALLY REMOVE CONDUCTIVE LAYER

FIELD

The subject matter herein generally relates to a printed circuit board.

BACKGROUND

In the field of printed circuit boards, the circuit board generally includes plating wires to electroplate the surface treatment layers for the bonding pads after forming the solder mask layer. The plated wires are extended from the bonding pads to the edge of the printed circuit board and are covered by the solder mask layer.

BRIEF DESCRIPTION OF THE DRAWINGS

Implementations of the present technology will now be described, by way of example only, with reference to the attached figures.

DETAILED DESCRIPTION

Figure 1:
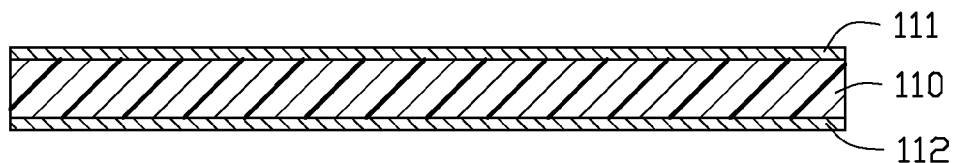
FIG. 1 is a cross sectional view of a substrate according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 to FIG. 10 illustrate a method of making a printed circuit board 10.

FIGS. 1 to 10 are presented in accordance with an example embodiment. The example shown in FIGS. 1 to 10 is provided by way of example, as there are a variety of ways to carry out the method. The method described below can be carried out using the configurations illustrated in FIGS. 1 to 10, for example, and various elements of these figures are referenced in explaining example method. Each of FIGS. 1 to 10 represents one or more processes, methods or subroutines, carried out in the example method. Furthermore, the illustrated order of FIGS. 1 to 10 is illustrative only and the order of FIGS. 1 to 10 can change according to the present disclosure. Additional processes can be added or fewer processes may be utilized, without departing from this disclosure.

FIG. 1 illustrates a substrate 11 including a base layer 110, a first copper foil layer 111 positioned on one side of the base layer 110, and a second copper foil layer 112 opposite to the first copper foil layer 111 and positioned on another side of the base layer 110.

The base layer 110 can be a flexible resin layer, such as polyimide (PI), polyethylene terephthalate (PET), or polyethylene naphthalate (PEN). In other embodiments, the base layer 110 can be a multilayer flexible substrate, including the alternative multiple conductive resin layers and multiple wiring layers. The first copper foil layer 111 and the second copper foil layer 112 have a uniform thickness. The thickness of the first copper foil layer 111 is the same as the thickness of the second copper foil layer 112 in at least one embodiment.

Figure 2:
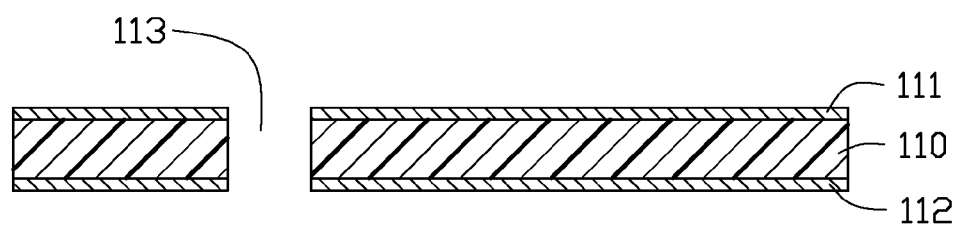
FIG. 2 is a cross sectional view of a substrate in FIG. 1 after drilling a through hole according to the present disclosure.

FIG. 2 illustrates a through hole 113 formed on the substrate 11 by a mechanical drilling method or a laser ablation method. The through hole 113 penetrates through the first copper foil layer 111, the base layer 110, and the second foil layer 112.

Figure 3:
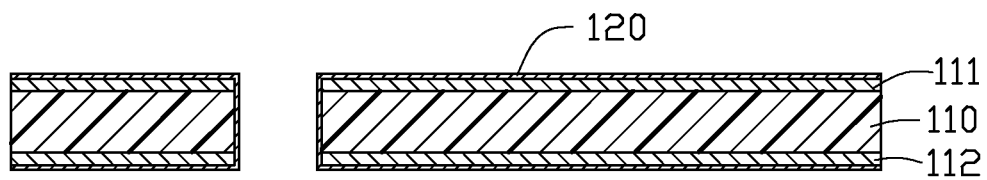
FIG. 3 is a cross sectional view of a substrate in FIG. 2 after forming a seed layer on the surfaces of the copper foil layers and the wall of the through hole according to the present disclosure.

FIG. 3 illustrates a seed layer 120 formed on the surfaces of the first copper foil layer 111 and the second copper foil layer 112, and also formed on the wall of the through hole 113.

The seed layer 120 can be formed by a black hole process, a shadow process, or an electroless plating process. In at least one embodiment, the seed layer 120 is formed by electroless copper plating. In other embodiments, the seed layer 120 can be eliminated or formed only on the wall of the through hole 113.

Figure 4:
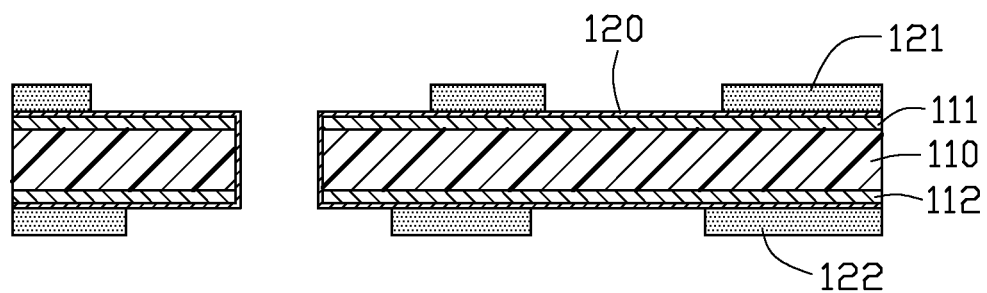
FIG. 4 is a cross sectional view of a substrate in FIG. 3 after forming the first and second patterned resist layers on part of the surface of the seed layer according to the present disclosure.
Figure 5:
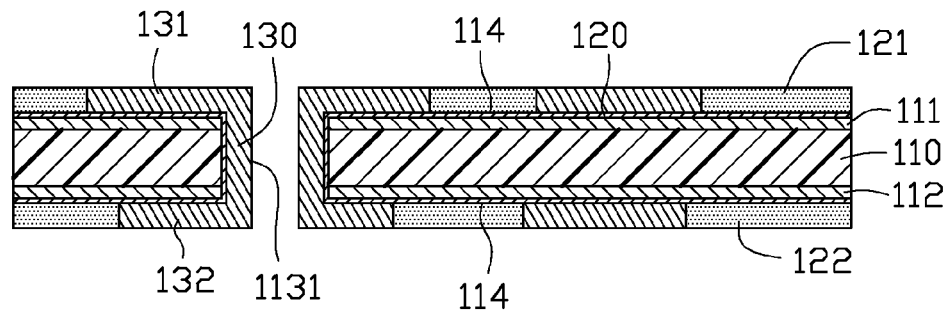
FIG. 5 is a cross sectional view of a substrate in FIG. 4 after forming the first and second conductive layers on part of the surface of the seed layer without removing the first and second patterned resist layers according to the present disclosure.

FIG. 4 and FIG. 5 illustrate a first patterned resist layer 121 and a second patterned resist layer 122 respectively formed on the surfaces of the seed layers 120 located on the first copper foil layer 111 and the second copper foil layer 112. And then, a first conductive layer 131 is formed by electroplating on partial surface of the seed layer 120 which is exposed from the first patterned resist layer 121 and positioned on the surface of the first copper foil layer 111, a second conductive layer 132 is also formed by electroplating on partial surface of the seed layer 120 which is exposed from the second patterned resist layer 122 and positioned on the surface of the second copper foil layer 112, and a third conductive layer 130 is also formed by electroplating on the surface of the seed layer 120 which is positioned on the wall of the through hole 113. After plating the third conductive layer 130, the through hole 113 with the third conductive layer 130 is changed as a conductive through layer 1131. The conductive through hole 1131 electrically connects the first conductive layer 131 and the second conductive layer 132. In at least one embodiment, the first patterned resist layer 121 and the second patterned resist layer 122 can be dry film.

Both of the first conductive layer 131 and the second conductive layer 132 have a uniform thickness. The thicknesses of the first conductive layer 131 and the second conductive layer 132 are the same and are greater than the thicknesses of the first copper foil layer 111 and the second copper foil layer 112. In addition, the thickness of the first conductive layer 131 is greater than the sum of the thicknesses of the first copper foil layer 111 and the seed layer 120.

All of the seed layer 120, the first copper foil layer 111, and the second copper foil layer 112 which are not covered by the first conductive layer 131 and the second conductive layer 132 are formed as a removable plating wire 114 to electrically connect the first conductive layer 131 and the second conductive layer 132.

Figure 6:
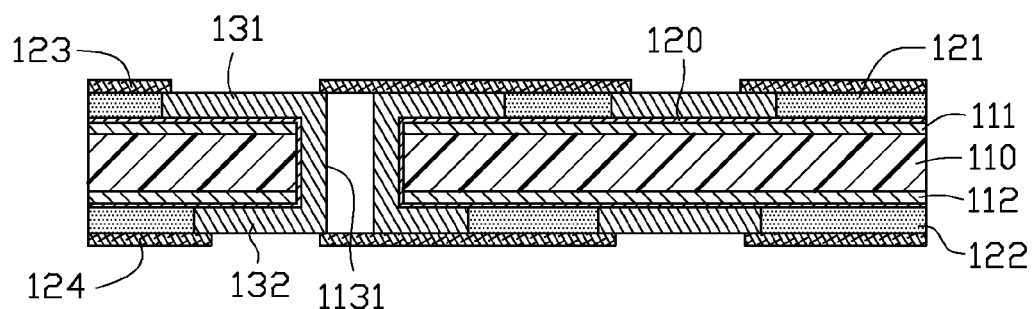
FIG. 6 is a cross sectional view of a substrate in FIG. 5 after forming the third and fourth patterned resist layers on the surfaces of the first and second patterned resist layers and part of the surfaces of the first and second conductive layers according to the present disclosure.
Figure 7:
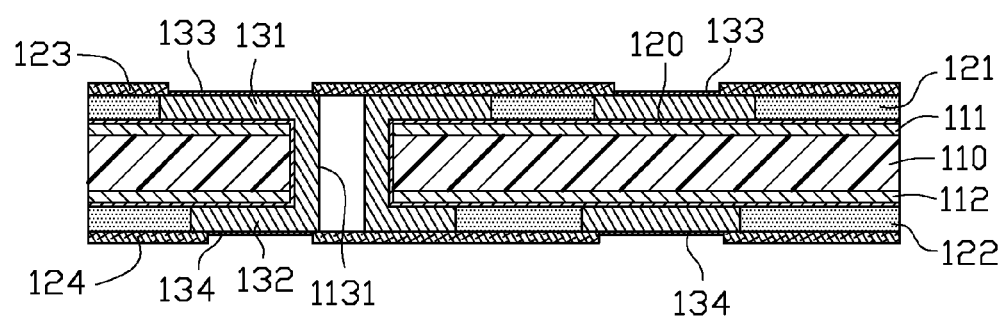
FIG. 7 is a cross sectional view of a substrate in FIG. 6 after forming the first and second surface treatment patterned layers on the exposed surfaces of the first and second conductive layers according to the present disclosure.

FIG. 6 and FIG. 7 illustrate a third patterned resist layer 123 formed on the surface of the first conductive layer 131 and the first patterned resist layer 121. The third patterned resist layer 123 covers the full surface of first patterned resist layer 121 and covers part of the surface of the first conductive layer 131. In addition, a fourth patterned resist layer 124 is formed on the surfaces of the second conductive layer 132 and the second patterned resist layer 122. The fourth patterned resist layer 124 covers the full surface of the second patterned resist layer 122 and covers part of the surface of the second conductive layer 132. And then, the first conductive layer 131 which is exposed from the third patterned resist layer 123 and the second conductive layer 132 which is exposed from the fourth patterned resist layer 124 receive a surface treatment process. After the surface treatment process, a first surface treatment patterned layer 133 is formed on the exposed surface of the first conductive layer 131 and a second surface treatment patterned layer 134 is formed on the exposed surface of the second conductive layer 132 for protecting the first conductive layer 131 and the second conductive layer 132, respectively. The first surface treatment patterned layer 133 and the second surface treatment patterned layer 134 can be made of a nickel-gold (Ni—Au) layer, a nickel-platinum-gold (Ni—Pt—Au) layer, or a nickel-palladium-gold (Ni—Pd—Au) layer. As mentioned above, the removable plating wire 114 including all of the seed layer 120, the first copper foil layer 111, and the second copper foil layer 112 which are not covered by the first conductive layer 131 or the second conductive layer 132 is used to electrically connect the first conductive layer 131 and the second conductive layer 132 and is used for respectively electroplating the first surface treatment patterned layer 133 and the second surface treatment patterned layer 134 on the surfaces of the first conductive layer 131 and the second conductive layer 132 during the surface treatment process. In at least one embodiment, the removable plating wire 114 mentioned above is used as the plating wire for electroplating the surface treatment patterned layers.

Figure 8:
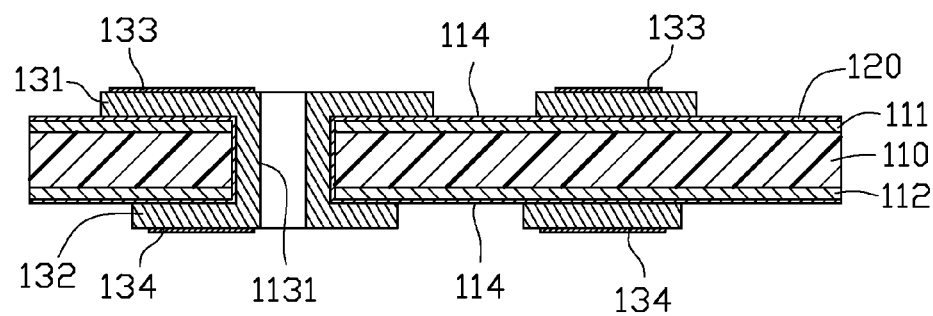
FIG. 8 is a cross sectional view of a substrate in FIG. 7 after removing the first, second, third, and fourth patterned resist layers according to the present disclosure.
Figure 9:
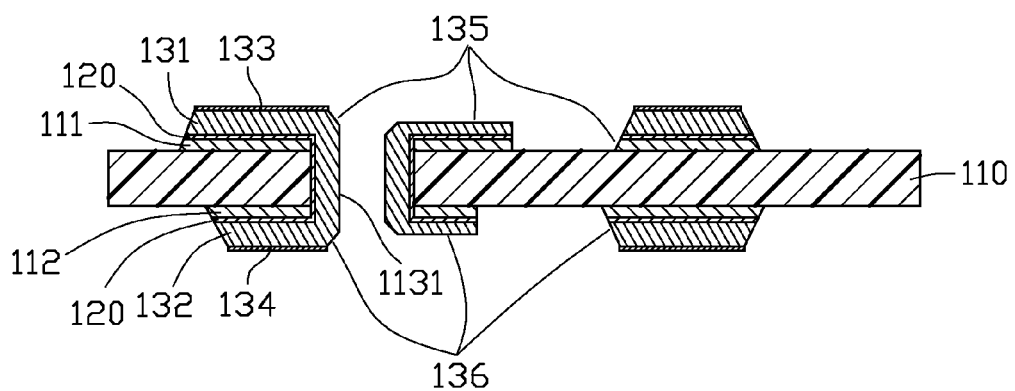
FIG. 9 is a cross sectional view of a substrate in FIG. 8 after etching part of the first and second conductive layers without covering the first and second surface treatment patterned layers, the exposed seed layers, and the first and second copper foil layers under the exposed seed layers according to the present disclosure.

FIG. 8 and FIG. 9 illustrate that the first patterned resist layer 121, the second patterned resist layer 122, the third patterned resist layer 123, and the fourth patterned resist layer 124 are removed. After removing the patterned resist layers, each of the seed layer 120, the first copper foil layer 111, and the second copper foil layer 112 which are exposed from the first conductive layer 131 or the second conductive layer 132 are etched. And then, a first conductive pattern 135 and a second conductive pattern 136 are formed on the different sides of the base layer 110.

In at least one embodiment, the first surface treatment patterned layer 133 and the second surface treatment patterned layer 134 are respectively used as mask layers for etching the first conductive layer 131 and the second conductive layer 132, and the first conductive layer 131 and the second conductive layer 132 are used as mask layers for etching the seed layer 120. The seed layer 120 which is exposed from the first conductive layer 131 or the second conductive layer 132 is removed by etching. In addition, the first copper foil layer 111 and the second copper foil layer 112 under the exposed seed layer 120 are also removed by etching in the same process. Since all of the seed layer 120, the first copper foil layer 111, and the second copper foil layer 112 which are exposed from the first conductive layer 131 or the second conductive layer 132 are etched, it means that the removable plating wire 114 is removed by etching without any residual wire extending to the end of the substrate 11.

The first conductive layer 131 and the second conductive layer 132 which are respectively not covered with the first surface treatment patterned layer 133 and the second surface treatment patterned layer 134 are exposed to the etching solution and are also etched to reduce the thicknesses. As mentioned above, the first conductive layer 131 and the second conductive layer 132 both have a uniform thickness. The thicknesses of the first conductive layer 131 and the second conductive layer 132 are the same and are greater than the thicknesses of the first copper foil layer 111 and the second copper foil layer 112. In addition, the thickness of the first conductive layer 131 is greater than the sum of the thicknesses of the first copper foil layer 111 and the seed layer 120. Therefore, when removing the seed layer 120, the first copper foil layer 111, and the second copper foil layer 112 which are not covered with the first conductive layer 131 or the second conductive layer 132 by etching, the first conductive layer 131 and the second conductive layer 132 which are respectively not covered with the first surface treatment patterned layer 133 and the second surface treatment patterned layer 134 are also etched to reduce the thicknesses. After etching, the first conductive pattern 135 is formed by the first copper foil layer 111, the seed layer 120 on the first copper foil layer 111, and the first conductive layer 131 on the seed layer 120. In addition, the second conductive pattern 136 is formed by the second copper foil layer 112, the seed layer 120 on the second copper foil layer 112, and the second conductive layer 132 on the seed layer 120. The first conductive pattern 135 and the second conductive pattern 136 are electrically connected by the conductive through hole 1131.

In the present embodiment, the thickness of the first conductive pattern 135 which is covered with the first surface treatment patterned layer 133 is greater than the thickness of the first conductive pattern 135 which is not covered with the first surface treatment patterned layer 133. In addition, the thickness of the second conductive pattern 136 which is covered with the second surface treatment patterned layer 134 is greater than the thickness of the second conductive pattern 136 which is not covered with the second surface treatment patterned layer 134.

In this disclosure, the different layers with different thicknesses and characteristics result in different etching rates for an etching solution. The side walls of the first conductive pattern 135 and the second conductive pattern 136 in at least one embodiment are not perpendicular to the base layer 110 and are tilted with respect to the base layer 110 at an oblique angle. Therefore, the cross section of the first conductive pattern 135 and the second conductive pattern 136 is a trapezoidal shape. The width of the first conductive pattern 135 is decreased with the direction from the base layer 110 to the first surface treatment patterned layer 133. In addition, the width of the second conductive pattern 136 is decreased with the direction from the base layer 110 to the second surface treatment patterned layer 134.

Figure 10:
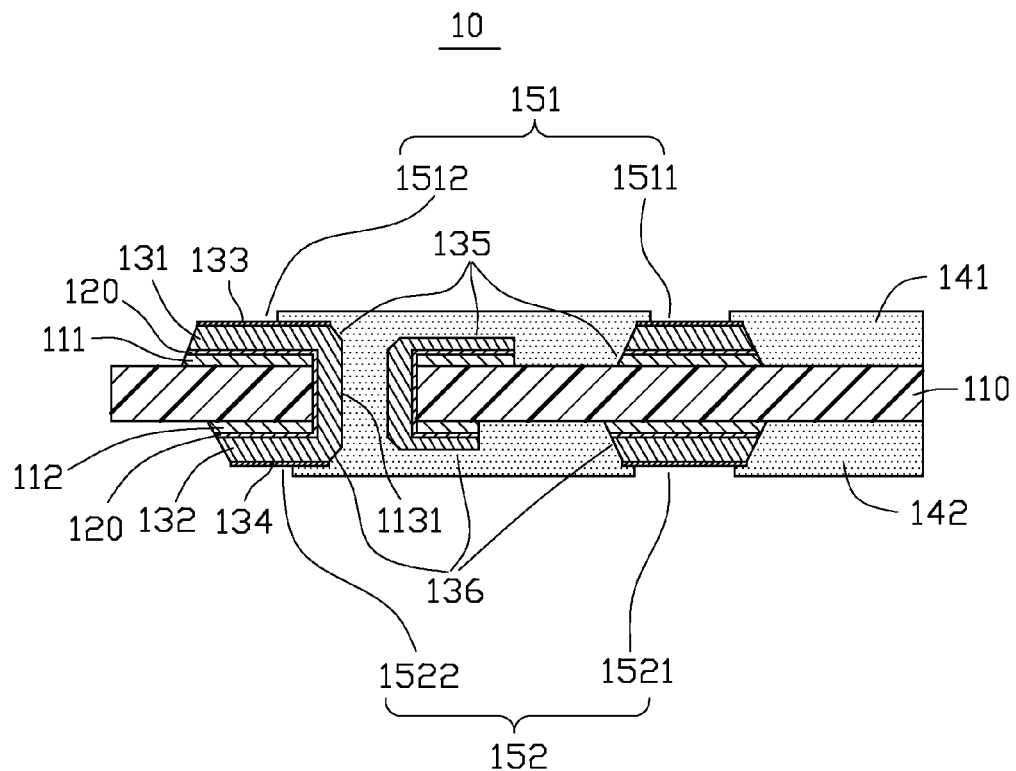
FIG. 10 is a cross sectional view of a substrate in FIG. 9 after forming the first solder mask layer and the second solder mask layer on the surfaces of the first and second conductive layers which are not covered with the first and second surface treatment patterned layers and on part of the surfaces of the first and second surface treatment patterned layers according to the present disclosure.

FIG. 10 illustrates a first solder mask layer 141 and a second solder mask layer 142 formed on the surfaces of the first conductive pattern 135 and the second conductive pattern 136. Thereby, a printed circuit board 10 is obtained.

In at least one embodiment, the first solder mask layer 141 covers the surface of the first conductive pattern 135 which is exposed from the first surface treatment patterned layer 133 and covers a portion of the surfaces of the first surface treatment patterned layer 133 and the base layer 110 at the same side. The portion of the first surface treatment patterned layer 133 exposed from the first solder mask layer 141 is used as a first connective portion 151. The first connective portion 151 includes a first bonding pad 1511 and a first conductive finger 1512. In the same process, the second solder mask layer 142 covers the surface of the second conductive pattern 136 which is exposed from the second surface treatment patterned layer 134 and covers a portion of the surfaces of the second surface treatment patterned layer 134 and the base layer 110 at the same side. The portion of the second surface treatment patterned layer 134 exposed from the second solder mask layer 142 is used as a second connective portion 152. The second connective portion 152 includes a second bonding pad 1521 and a second conductive finger 1522.

In this disclosure, the removable plating wire 114 is removed by etching before forming the solder mask layer and without any residual wire needing to be extended to the edge of the substrate 11. The electroplating process is used for plating the first surface treatment patterned layer 133 and the second surface treatment patterned layer 134 by using the removable plating wire 114. The electroplating process is simplified by using the removable plating wire 114 instead of the traditional plating wires, and the electroplating process eliminates the traditional plated wires under the solder mask layer for plating the first surface treatment patterned layer 133 and the second surface treatment patterned layers 134 effectively to reduce the noise of signal transmission and make the fine pitch circuit design possible.

It can be understood that the method of manufacturing a printed circuit board 10 further includes the steps to remove the waste parts.

A printed circuit board 10 is also disclosed in this invention. The printed circuit board 10 includes a substrate 11 comprising a base layer 110, a first conductive pattern 135 formed on one side of the base layer 110, and a second conductive pattern 136 opposite to the first conductive pattern 135 and formed on another side of the base layer 110. The substrate 11 also includes a first surface treatment patterned layer 133 formed on part of the surface of the first conductive pattern 135, and a second surface treatment patterned layer 134 formed on part of the surface of the second conductive pattern 136. The substrate 11 further comprises a first solder mask layer 141 formed on part of the surface of the first surface treatment patterned layer 133 and the first conductive pattern 135, and a second solder mask layer 142 formed on part of the surface of the second surface treatment patterned layer 134 and the second conductive pattern 136.

In at least one embodiment, the first solder mask layer 141 covers the surface of the first conductive pattern 135 which is exposed from the first surface treatment patterned layer 133, and covers partial surfaces of the first surface treatment patterned layer 133 and the base layer 110 at the same side. The portion of the first surface treatment patterned layer 133 exposed from the first solder mask layer 141 is used as a first connective portion 151. The second solder mask layer 142 covers the surface of the second conductive pattern 136 which is exposed from the second surface treatment patterned layer 134 and covers part of the surfaces of the second surface treatment patterned layer 134 and the base layer 110 at the same side. The portion of the second surface treatment patterned layer 134 exposed from the second solder mask layer 142 is used as a second connective portion 152. The printed circuit board 10 further includes at least one through hole 113.

The printed circuit board 10 further includes a first copper foil layer 111 positioned on a surface of the base layer 110, and a second copper foil layer 112 opposite to the first copper foil layer 111.

The printed circuit board 10 further includes a first conductive layer 131 positioned on the surface of the first copper foil layer 111, a second conductive layer 132 positioned on the surface of the second foil layer 112, and a third conductive layer 130 positioned on the wall of the through hole 113 to let the through hole 113 become as a conductive through hole 1131. The conductive through hole 1131 electrically connects with the first conductive pattern 135 and the second conductive pattern 136.

The printed circuit board 10 further includes a seed layer 120 formed on the surface of the first copper foil layer 111, the surface of the second copper foil layer 112, and the wall of the conductive through hole 1131. The seed layer 120 formed on the surface of first copper foil layer 111 is positioned between the first copper foil layer 111 and the first conductive layer 131. In addition, the seed layer 120 formed on the surface of second copper foil layer 112 is positioned between the second copper foil layer 112 and the second conductive layer 132. In the illustrated embodiment, the seed layer 120 is positioned under the first conductive layer 131, the second conductive layer 132, and the third conductive layer 133.

The first conductive pattern 135 of the printed circuit board 10 can be made by at least one of the first copper foil layer 111, the second copper foil layer 112, the seed layer 120, the first conductive layer 131, or the second conductive layer 132.

The substrate 11 may include a plurality of units for forming a plurality of printed circuit boards 10. After the first solder mask layer 141 and the second solder mask layer 142 are formed on the substrate 11, the substrate 11 can be cut to form a plurality of separated printed circuits boards 10.

The method of manufacturing a printed circuit board 10 in present disclosure is to form a conductive layer on the surfaces of the first copper foil layer 111 and the second copper foil layer 112 by electroplating. The conductive layer includes the first conductive layer 131, the second conductive layer 132, and the third conductive layer 130. Because the first copper foil layer 111 and the second copper foil layer 112 are not etched at this moment, the first copper foil layer 111 and the second copper foil layer 112 are continuous layers. After electroplating the conductive layer and forming the conductive through hole 1131, the entire substrate 11 is electrically conductive. All of the first copper foil layer 111, the second copper foil layer 112, and the seed layer 120 not covered by the first conductive layer 131 or the second conductive layer 132 can be used as a removable plating wire 114 to electroplate the first surface treatment patterned layer 133 and the second surface treatment patterned layer 134 on the conductive layer. The removable plating wire 114 can avoid the residual plated wires having unfavorable effects on the signal transmission and ensure the electrical quality of the printed circuit board. In this disclosure, no additional plated wires are required and the space for the wiring design is increased to benefit the fine pitch design. In addition, the conductive layer formed by the electroplating has better anti scratch properties.

The embodiments shown and described above are only examples. Many details are often found in the art such as the other features of a printed circuit board. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of manufacturing a printed circuit board comprising: providing a substrate comprising a base layer and a first copper foil layer formed on one side of the base layer; electroplating a first conductive layer on a portion of a surface of the first copper foil layer away from the base layer; electroplating a first surface treatment patterned layer on a portion of a surface of the first conductive layer away from the first copper foil layer, to leave other portion of the first conductive layer and other portion of the first copper foil layer exposed from the first surface treatment patterned layer; and etching to remove exposed portion of the first copper foil layer and to thin exposed portion of the first conductive layer.

2. The method of manufacturing a printed circuit board of claim 1, wherein the first conductive layer is thicker than the first copper foil layer.

3. The method of manufacturing a printed circuit board of claim 1, wherein the first surface treatment patterned layer is made of nickel-gold (Ni—Au), nickel-platinum-gold (Ni—Pt—Au), or nickel-palladium-gold (Ni—Pd—Au).

4. The method of manufacturing a printed circuit board of claim 1, wherein the method further comprises:
forming a first solder mask layer on a surface of the first conductive layer which is not covered with the first surface treatment patterned layer, the first solder mask layer covers a portion of the surface of the first surface treatment patterned layer and the base layer at a same side, the first surface treatment patterned layer exposed from the first solder mask layer becomes a connective portion for electrically connection.

5. The method of manufacturing a printed circuit board of claim 1, wherein the substrate further comprises a second copper foil layer formed on another side of the base layer opposite to the first copper foil layer, the method prior to electroplating the first conductive layer further comprises:
drilling a through hole through the base layer from the first copper foil layer to the second copper foil layer; and
forming a seed layer on a wall of the through hole and on surfaces of the first copper foil layer and the second copper foil layer.

6. The method of manufacturing a printed circuit board of claim 5, wherein a thickness of the first conductive layer is greater than a sum of thicknesses of the first copper foil layer and the seed layer.

7. The method of manufacturing a printed circuit board of claim 5, wherein the method for electroplating the first conductive layer further comprises: electroplating a second conductive layer on a portion of a surface of the seed layer located on the second copper foil layer away from the base layer, and eletroplating a third conductive layer on a surface of the seed layer located on the wall of the through hole, each of the seed layer, the first copper foil layer, and the second copper foil layer which are not covered with the first conductive layer or the second conductive layer is formed as a removable plating wire.

8. The method of manufacturing a printed circuit board of claim 7, wherein a thickness of the second conductive layer is greater than a sum of thicknesses of the second copper foil layer and the seed layer positioned on the second copper foil layer.

9. The method of manufacturing a printed circuit board of claim 7, wherein the second conductive layer has a same thickness as the first conductive layer.

10. The method of manufacturing a printed circuit board of claim 7, wherein the method for etching the first copper foil layer which is not covered with the first conductive layer further comprises:
etching to remove the seed layer which is not covered with the first conductive layer or the second conductive layer, and
etching to remove the second copper foil layer which is not covered with the second conductive layer, wherein after etching, the first copper foil layer, the seed layer positioned on the first copper foil layer, and the first conductive layer positioned on the seed layer are formed as a first conductive pattern, and the second copper foil layer, the seed layer positioned on the second copper foil layer, and the second conductive layer positioned on the seed layer are formed as a second conductive pattern.

* * * * *